United States Patent [19]

Okumura

[11] Patent Number: 5,798,530
[45] Date of Patent: Aug. 25, 1998

[54] METHOD AND APPARATUS FOR ALIGNING A MASK AND A SET OF SUBSTRATES TO BE EXPOSED

[75] Inventor: Masahiko Okumura, Tokyo, Japan

[73] Assignee: Nikon Corporation, Tokyo, Japan

[21] Appl. No.: 729,938

[22] Filed: Oct. 15, 1996

Related U.S. Application Data

[63] Continuation of Ser. No. 351,568, Dec. 7, 1994, abandoned, which is a continuation of Ser. No. 158,984, Nov. 30, 1993, abandoned.

[30] Foreign Application Priority Data

Nov. 30, 1992 [JP] Japan ................................. 4-319979

[51] Int. Cl.$^6$ ........................................ G01N 21/86
[52] U.S. Cl. ........................... 250/548; 356/401
[58] Field of Search ........................ 250/548, 557; 356/400, 401; 414/935, 936, 937, 938

[56] References Cited

U.S. PATENT DOCUMENTS

| | | | |
|---|---|---|---|
| 4,070,117 | 1/1978 | Johannsmeier et al. | 356/172 |
| 4,531,060 | 7/1985 | Suwa et al. | 250/548 |
| 4,741,622 | 5/1988 | Suwa et al. | 356/401 |
| 4,780,617 | 10/1988 | Umatate et al. | 250/548 |
| 4,833,621 | 5/1989 | Umatate | 364/491 |
| 4,962,318 | 10/1990 | Nishi | 250/548 |
| 5,118,957 | 6/1992 | Kawashima et al. | 250/561 |
| 5,243,195 | 9/1993 | Nishi | 250/548 |
| 5,309,197 | 5/1994 | Mori et al. | 355/53 |
| 5,379,108 | 1/1995 | Nose et al. | 356/400 |

*Primary Examiner*—Stephone B. Allen
*Attorney, Agent, or Firm*—Shapiro and Shapiro

[57] ABSTRACT

An exposure apparatus is designed to reduce the influences of alignment errors due to dynamic fluctuations and improve the throughput while basically using an off-axis alignment scheme. A wafer stage on which a test wafer is place is step-driven in accordance with a shot arrangement in an exposure operation. Subsequently, variations in position of the wafer stage, which occur while the position of alignment marks observed by a TTR alignment system coincide with aimed positions, are stored. In an exposure operation with respect to a wafer to be exposed, the prestored variations in position of the wafer stage are reproduced when alignment of each shot area is performed in accordance with the position of each alignment mark, detected by an off-axis alignment system.

22 Claims, 3 Drawing Sheets

METHOD AND APPARATUS FOR ALIGNING A MASK AND A SET OF SUBSTRATES TO BE EXPOSED

This is a continuation of application Ser. No. 08/351,568 filed Dec. 7, 1994, which is a continuation of application Ser. No. 08/158,984 filed Nov. 30, 1993, both now abandoned.

BACKGROUND OF THE INVENTION

1. Field of the Invention

The present invention relates to a projection exposure apparatus and, more particularly, to an exposure method and an exposure apparatus which can be suitably applied to a projection exposure apparatus used when a semiconductor element, a liquid crystal display element, or the like is manufactured by a lithographic process.

2. Related Background Art

In the manufacture of a semiconductor element, a liquid crystal display element, or the like by a lithographic process, a projection exposure apparatus of a step-and-repeat scheme is used. This apparatus is designed to project a pattern image of a photomask or reticle (to be generically referred to as a reticle hereinafter) onto a photosensitive substrate on a stage through a projection optical system. In general, a semiconductor element or the like is formed by stacking a large number of circuit patterns on a substrate. For this reason, the projection exposure apparatus includes an alignment system for accurately aligning a pattern exposed on a photosensitive substrate in the previous step with a pattern image of a reticle which is to be exposed in the subsequent step. Conventional alignment systems can be roughly classified into an off-axis alignment system for performing alignment without the mediacy of a projection optical system, and a through-the-reticle (to be referred to as "TTR" hereinafter) alignment system for performing alignment through a projection optical system.

Conventional alignment systems other than TTR alignment systems include a through-the-lens (to be referred to "TTL" hereinafter) alignment system designed to detect only an alignment mark on a wafer through a projection lens without detecting any alignment mark on a reticle, and an off-axis alignment system designed to detect an alignment mark on a wafer through an objective lens independently arranged to be separated from a projection lens by a predetermined distance. In a projection exposure apparatus having a TTL or off-axis alignment system, the position of an alignment mark formed beforehand near each shot area on a photosensitive substrate in the previous step is detected by using both the off-axis or TTL alignment system, which detects no alignment mark on a reticle, and a stage position detection means such as a laser interferometer. In addition, a baseline amount which is the distance between the detection center of the alignment system and the optical axis of the projection optical system is obtained in advance. The photosensitive substrate is sequentially aligned with the positions obtained by correcting the detected positions by the baseline amount, thereby effecting exposure on each shot area on the photosensitive substrate.

In a projection exposure apparatus having a TTR alignment system, the position of a stage at which exposure is to be effected is not obtained, but alignment of a reticle and a photosensitive substrate is performed by simultaneously observing a mark on the photosensitive substrate and a mark on the reticle, thereby effecting exposure.

The above-mentioned TTR, TTL, and off-axis alignment systems are described in detail in, e.g., U.S. Pat. No. 4,962,318.

In the projection exposure apparatus having the off-axis alignment system, alignment of a reticle and a photosensitive substrate in an exposure operation is dependent only on the position detection result obtained by the stage position detection means such as a laser interferometer. For this reason, even if a relative error occurs in an exposure target position on a photosensitive substrate and a position at which an image of a reticle is projected, the accurate error amount cannot be obtained. Note that such a relative error is caused by fluctuations in the positions or postures of the reticle and the projection optical system owing to vibrations produced upon high-speed operation of the stage, or fluctuations in the refractive index or the like of air in the optical path of the laser interferometer owing to the movement of the stage. This relative error becomes an error factor in alignment. In order to prevent the generation of vibrations, the driving speed of the stage may be decreased, or alignment may be performed after vibrations are reduced. However, these countermeasures lead to a decrease in throughput.

In the projection exposure apparatus having the TTR alignment system, since the position of a reticle image and an exposure target position on a wafer can be simultaneously and directly observed, the above-described error factor can be eliminated. However, TTR alignment with respect to each shot causes a decrease in throughput. In addition, an alignment mark must always be formed at a position where the mark can be observed through the TTR alignment system when an exposure target position on a photosensitive substrate coincides with a reticle image. This imposes limitations on the design of a pattern to be exposed. Furthermore, in the TTR alignment system, it is difficult to increase the bandwidth of light used to detect alignment marks because of the influences of a chromatic aberration of the projection optical system. Therefore, the alignment system is susceptible to interference and the like depending on the state of a photosensitive substrate, and errors may occur in the detection of alignment marks.

SUMMARY OF THE INVENTION

The present invention has been made in consideration of the above situation, and has as an object to provide an exposure method which uses an alignment system (designed to detect a wafer mark without the mediacy of a mask) other than a TTR alignment system, and can increase the throughput in an exposure process while reducing the influences of alignment error factors due to various dynamic fluctuations.

In order to achieve the above object, the present invention uses a projection exposure apparatus including a projection optical system for projecting a pattern formed on a mask onto a substrate, a substrate stage holding the substrate and capable of moving within a plane substantially perpendicular to an optical axis of the projection optical system, and stage position detection means for detecting a position of the substrate stage within the plane, and performs the first step of storing a state of position deviation of the substrate stage when a mark on a first substrate is detected through the mask and the projection optical system;

the second step of detecting a position of a mark on a second substrate without the mediacy of the mask; and the third step of aligning the second substrate in accordance with the position of the mark obtained in the second step, and moving the substrate stage in accordance with the state of position deviation when a pattern of the mask is to be projected on the second substrate.

According to another aspect of the present invention, the present invention uses a projection exposure apparatus including a projection optical system for projecting a pattern formed on a mask onto a substrate, a substrate stage holding the substrate and capable of moving within a plane substantially perpendicular to an optical axis of the projection optical system, and a laser interferometer for outputting a detection signal corresponding to a position of the substrate stage within the plane, and performs the first step of detecting a mark on a first substrate through the mask and the projection optical system, and storing a detection signal from the laser interferometer while a predetermined positional relationship between the mask and the first substrate is maintained;

the second step of detecting a position of a mark on a second substrate without the mediacy of the mask; and the third step of aligning the second substrate in accordance with the position of the mark obtained in the second step, and moving the substrate stage in accordance with the detection signal when a pattern of the mask is to be projected on the second substrate.

It is another object of the present invention to provide an exposure apparatus which uses an alignment system other than a TTR alignment system, and can increase the throughput in an exposure process while reducing the influences of alignment error factors due to various dynamic fluctuations. In order to achieve the above object, the present invention comprises:

a projection optical system for projecting a pattern formed on a mask onto a substrate;

a substrate stage holding the substrate and capable of moving within a plane substantially perpendicular to an optical axis of the projection optical system;

stage position detection means for detecting a position of the substrate stage within the plane;

a first alignment system for detecting a mark on the substrate through the mask and the projection optical system;

a second alignment system for detecting a position of a mark on the substrate without the mediacy of the mask;

storage means for storing a state of position deviation, of the substrate stage, detected by the stage position detection means during detection of a mark on the substrate by the first alignment system; and control means for aligning the substrate stage in accordance with the position of the mark detected by the second alignment system, the control means moving the substrate stage in accordance with the state of position variation read out from the storage means when the pattern is to be projected on the substrate.

According to another aspect of the present invention, the present invention comprises:

a projection optical system for projecting a pattern formed on a mask onto a substrate;

a substrate stage holding the substrate and capable of moving within a plane substantially perpendicular to an optical axis of the projection optical system;

a laser interferometer for outputting a detection signal corresponding to a position of the substrate stage within the plane;

a first alignment system for detecting a mark on the substrate through the mask and the projection optical system;

a second alignment system for detecting a position of a mark on the substrate without the mediacy of the mask;

first control means for controlling the substrate stage so as to maintain a predetermined positional relationship between the mask and the substrate in accordance with detection information from the first alignment system;

a storage section for storing a detection signal from the laser interferometer when the first control section controls the substrate stage; and second control means for aligning the substrate stage in accordance with the position of the mark detected by the second alignment system, the second control means moving the substrate stage in accordance with the detection signal read out from the storage section when the pattern is to be projected on the substrate.

According to the exposure method of the present invention, in the first step, fluctuations in movement of the exposure apparatus are measured by using the TTR alignment system and the substrate stage detection means prior to an exposure operation. In this case, the substrate stage is sequentially aligned in accordance with the positions, of alignment marks of the substrate, observed by the TTR alignment system. At the same time, variations in position of the substrate stage, expressed by, e.g., variations in output signal from the substrate stage position detection means, are stored.

In the second step, the positions of alignment marks of the substrate are detected without the mediacy of the mask. In the third step, when exposure is to be effected with respect to the substrate, the position variations stored in the first step are used as position variations of the substrate stage in an operation of compensation for the fluctuations in movement of the exposure apparatus. That is, in an exposure operation, the substrate stage is driven in accordance with the position deviations of the substrate state, stored in advance, as aimed values, thereby reproducing the position deviations of the substrate stage, detected in advance. With this operation, the influences of alignment errors due to the dynamic fluctuations can be reduced.

Even if the position of the substrate state is changed by a vibrating force, this change in position hardly becomes an alignment error factor. Therefore, the acceleration of the substrate state in a step-driving operation can be increased. Since the residual vibrations of the substrate stage need not be reduced when exposure is effected with respect to a photosensitive substrate, the throughput in the exposure process can be improved.

Generally, in a TTR alignment system, it is difficult to use wide-bandwidth light in consideration of a chromatic aberration, and each alignment mark on a photosensitive substrate tends to be large in size. However, according to the present invention, since an alignment system for detecting each wafer mark without the mediacy of a mask is used, the precision in detecting the position of each alignment mark can be improved by using wide-bandwidth light. In addition, since the use of a relatively small alignment mark is allowed, an exposure area on a photosensitive substrate can be effectively used.

Dynamic fluctuations include components lacking repeatability, even if the movement of the substrate state remains the same. For this reason, in determining a state of position variation as an aimed control state, averaging may be required to some degree.

Furthermore, according to the exposure apparatus of the present invention, the exposure method using the same can be executed.

Figure 1:
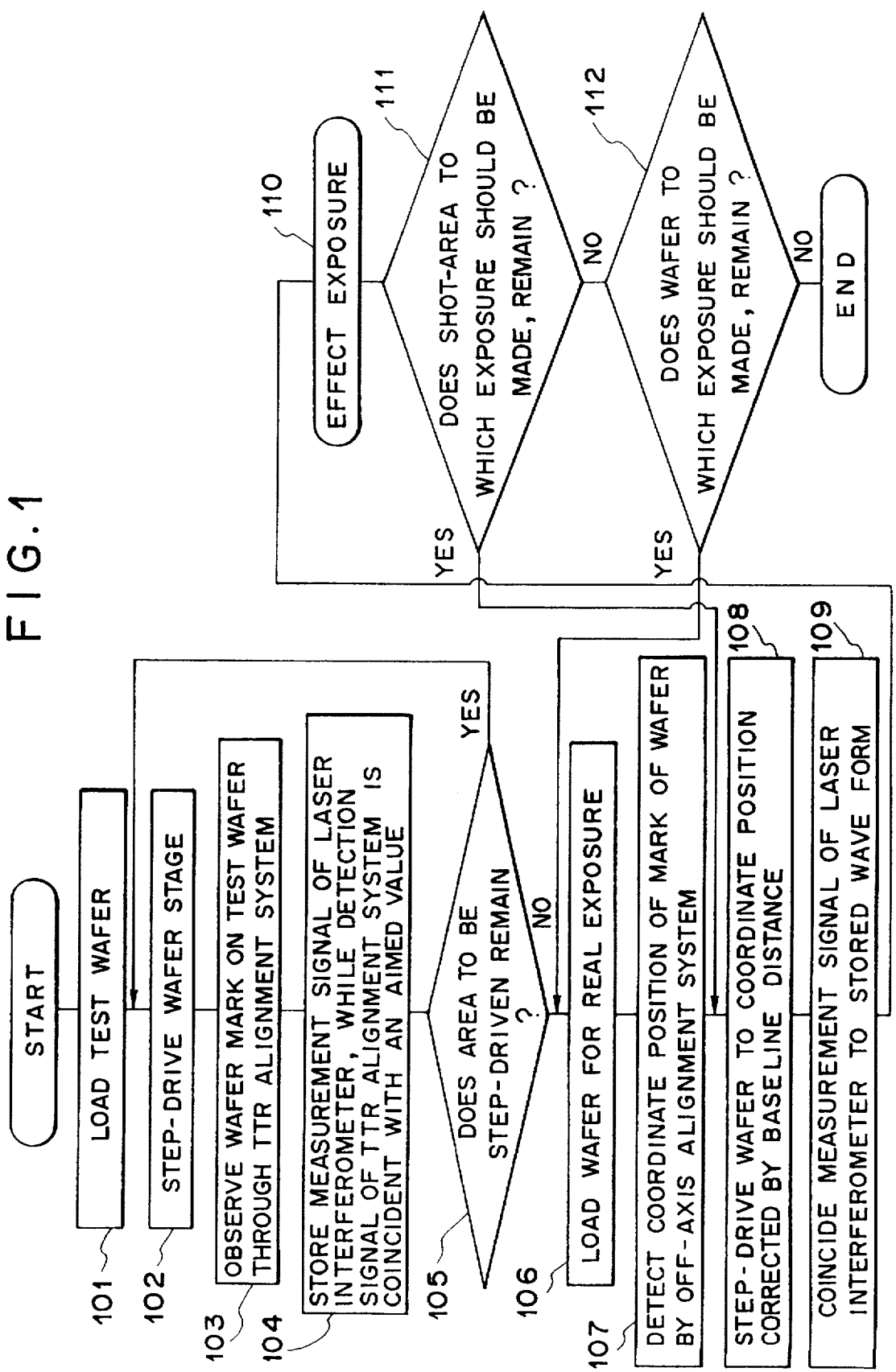
FIG. 1 is a flow chart showing an exposure operation of an embodiment of the present invention.
Figure 4:
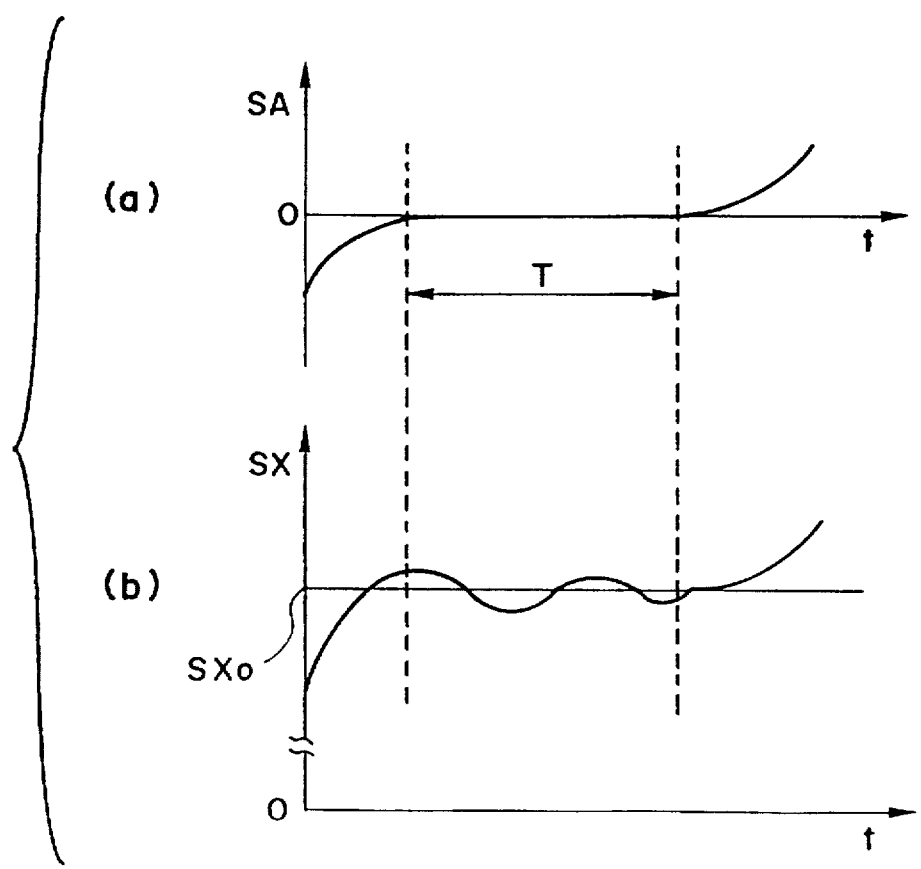

(a) in FIG. 4 is a graph showing the waveform of an X-direction detection signal of a detection signal SA in step 104 in FIG. 1; and X (b) in FIG. 4 is a graph showing the waveform of a measurement signal SX corresponding to the signal (a) in FIG. 4.

DESCRIPTION OF THE PREFERRED EMBODIMENT

An embodiment of the present invention will be described below with reference to the accompanying drawings. In this embodiment, the present invention is applied to a projection exposure apparatus for exposing a reticle pattern on a wafer as a photosensitive substrate by a step-and-repeat scheme.

Figure 2:
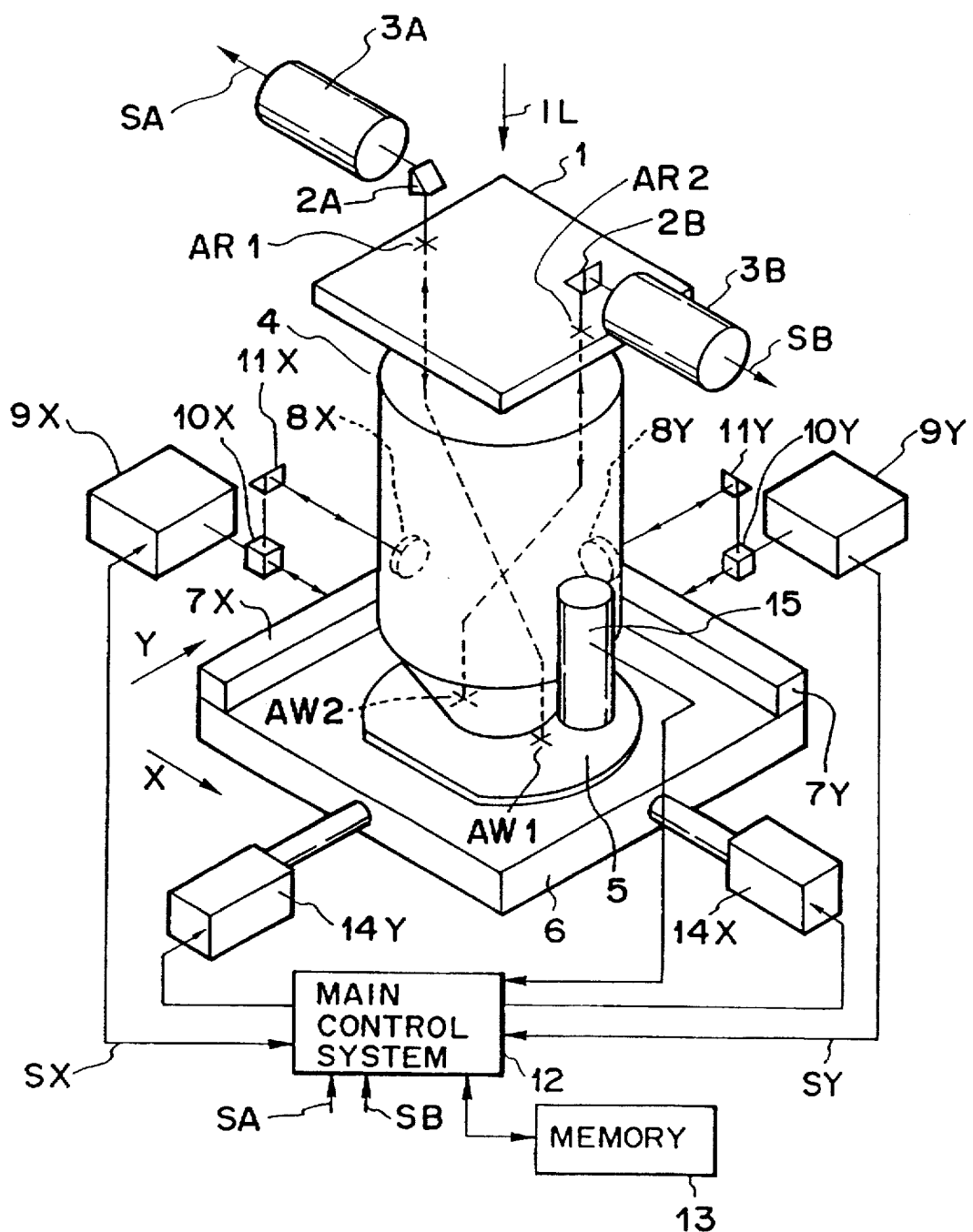
FIG. 2 is a perspective view showing the main part of a projection exposure apparatus for performing the exposure operation of the embodiment.

FIG. 2 shows a main part of the projection exposure apparatus of the embodiment. Referring to FIG. 2, a reticle 1 is placed on a reticle stage (not shown). An orthogonal coordinate system constituted by the X- and Y-axes is set to be parallel to the reticle 1. The reticle 1 has a pair of alignment marks AR1 and AR2 outside the pattern area of the reticle 1 in the X direction. Right-angle prisms 2A and 2B for bending optical paths are arranged above the alignment marks AR1 and AR2, respectively. Alignment systems 3A and 3B are respectively arranged in the directions in which the optical paths are bent by the right-angle prisms 2A and 2B. One alignment system 3A outputs a detection signal SA. The detection signal SA is a detection signal corresponding to the X- and Y-direction positional shift amounts of a conjugate image of a mark, formed on a substrate on a wafer stage 6 (to be described later), on the reticle 1 with respect to one alignment mark AR1 of the reticle 1. Similarly, the other alignment system 3B outputs a detection signal SB. The detection signal SB is a detection signal corresponding to the X- and Y-direction positional shift amounts of a conjugate image of a mark, formed on the substrate on the wafer stage 6, on the reticle 1 with respect to the other alignment mark AR2 of the reticle 1.

A projection optical system 4 and the wafer stage 6 for holding a wafer 5 are arranged below the reticle 1 in the order named. The wafer stage 6 is fixed to a base for supporting the projection optical system 4. The wafer stage 6 is constituted by an X-Y stage for positioning the wafer 5 within a plane perpendicular to the optical axis of the projection optical system 4 (i.e., the X-Y plane), a Z stage for positioning the wafer 5 in a direction parallel to the optical axis of the projection optical system 4, a leveling stage for leveling the wafer 5, and the like. When the wafer 5 is a wafer to which exposure should be made, the pattern area of the reticle 1 is illuminated with exposure light IL from an illumination optical system with a uniform illuminance. The resultant pattern image of the pattern area is projected/exposed on each shot area on the wafer 5 by the projection optical system 4.

Alignment marks are formed near the respective shot areas of the wafer 5. FIG. 2 shows a pair of alignment marks AW1 and AW2. The alignment marks AW1 and AW2 are marks to be observed through an off-axis alignment system, as will be described later. The alignment marks AR1 and AR2 of the reticle 1 are positioned such that when one alignment mark AW1 is at a position almost conjugate to one alignment mark AR1, the other alignment mark AW2 is set to be almost conjugate to the other alignment mark AR2.

A movable mirror 7X is disposed on an end portion of the wafer stage 6 in the X direction, while a reference mirror 8X is disposed on a side surface of the projection optical system 4 in the X direction. A movable mirror 7Y is disposed on an end portion of the wafer stage 6 in the Y direction, while a reference mirror 8Y is disposed on a side surface of the projection optical system 4 in the Y direction. A laser beam from an X-axis laser interferometer 9X is split into the first and second laser beams by a polarizing prism 10X. The first laser beam transmitted through the polarizing prism 10X propagates toward the movable mirror 7X. The second laser beam reflected by the polarizing prism 10x propagates toward the reference mirror 8X through a right-angle prism 11X. The first and second laser beams respectively reflected by the movable mirror 7X and the reference mirror 8X propagate through the optical paths reversely to be synthesized with each other. The laser interferometer 9X supplies a main control system 12 with a measurement signal SX corresponding to the X-direction coordinates of the wafer stage 6 with reference to the reference mirror 8X of the projection optical system 4 on the basis of the synthesized first and second laser beams.

Similarly, a laser beam from a Y-axis laser interferometer 9Y propagates toward the movable mirror 7Y and the reference mirror 8Y through a polarizing prism 10Y and a right-angle prism 11Y. The laser beams reflected by the movable mirror 7Y and the reference mirror 8Y propagate the optical paths reversely to be synthesized with each other. The laser interferometer 9Y supplies, to the main control system 12, a measurement signal SY corresponding to the Y-axis coordinates of the wafer stage 6 with reference to the reference mirror 8Y of the projection optical system 4. A memory 13 is connected to the main control system 12.

The memory 13 serves to store these measurement signals SX and SY for a predetermined period. The main control system 12 sets the coordinates of the wafer stage 6 to coordinates determined in accordance with an exposure sequence by step-driving the wafer stage 6 within the X-Y plane through X-axis and Y-axis drivers 14X and 14Y. In addition, the detection signals SA and SB from the TTR alignment systems 3A and 3B are supplied to the main control system 12.

An off-axis alignment system 15 is arranged beside the projection optical system 4. This alignment system 15 is also fixed on the base on which the projection optical system 4 is supported. By using the alignment system 15, the positions of alignment marks (e.g., the alignment marks AW1 and AW2) formed near the respective shot areas on the wafer 5 can be detected. A baseline amount which is the distance between the detection center of the alignment system 15 and the optical axis of the projection optical system 4 is obtained in advance.

Figure 3:
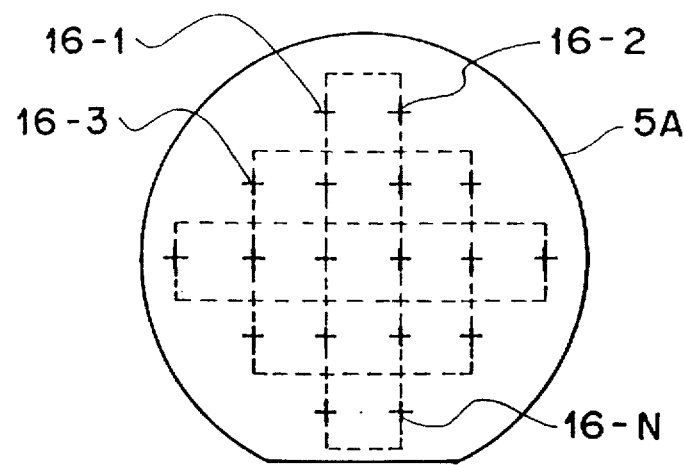
FIG. 3 is a plan view showing a test wafer used in the embodiment.

An exposure operation of the projection exposure apparatus of the embodiment will be described next with reference to the flow chart of FIG. 1. In step 101 of FIG. 1, a test wafer having alignment marks formed at required positions is placed on the wafer stage 6 in FIG. 2. A test wafer 5A shown in FIG. 3 is an example of the test wafer. A large number of alignment marks 16-1, 16-2, 16-3, . . . , 16-N are formed on the test wafer 5A to have substantially the same positional relationship with the alignment marks formed near the respective shot areas of a wafer to be actually exposed.

In step 102, the main control system 12 step-drives the wafer stage 6 on which the test wafer has almost the same shot arrangement as that formed in an actual exposure operation. Two alignment marks corresponding to actual exposure positions are observed by the alignment systems 3A and 3B through the projection optical system 4 and the reticle 1 in FIG. 2 (step 103). Illumination light radiated from each of the alignment systems 3A and 3B onto the test wafer through the reticle 1 and the projection optical system 4 has the same wavelength range as that of the exposure light IL for exposing a pattern of the reticle 1. With this operation, conjugate images of the alignment marks on the test wafer 5 are formed on the reticle 1. In this case, the main control system 12 controls the operation of the wafer stage 6 such that the positional shift amounts (in the X and Y directions) of the conjugate images of the two alignment marks on the test wafer with respect to the alignment marks AR1 and AR2 on the reticle 1 become a predetermined value (e.g., 0) (step 104).

(a) in FIG. 4 shows an X-direction detection signal of the detection signal SA output from the alignment system 3A in FIG. 2 in a case wherein the main control system 12 controls the operation of the wafer stage 6 in step 104 such that the positional shift amounts of the conjugate images of the two alignment marks on the test wafer with respect to the alignment marks on the reticle 1 become 0. The X-direction detection signal of the detection signal SA keeps coinciding with 0 as an aimed value for a predetermined sampling period T. In order to obtain the detection signal SA, alignment marks must be formed at positions on the test wafer where the marks can be read by the alignment system 3A. In addition, as the alignment marks 16-1 to 16-N on the test wafer, marks having a size and a shape with which read errors of the alignment systems 3A and 3B does not easily occur must be used.

In the period during which the X-direction detection signal of the detection signal SA keeps coinciding with 0, as shown (a) in FIG. 4, the X-direction measurement signal SX from the X-axis laser interferometer 9X in FIG. 2 does not always coincide with an aimed value $SX_0$ (the position of the wafer stage 6 when the position shift amounts of the marks on the test wafer 5 with respect to the marks on the reticle 1 become 0) but varies near the aimed value $SX_0$, as shown (b) in FIG. 4. At this time, a positional shift of the reticle 1, distortion of the projection optical system 4 and the base of the projection exposure apparatus, and the like are caused by a vibrating force generated by the fast stepping operation of the wafer stage 6, and the imaging position of each alignment mark on the test wafer is laterally shifted on the reticle 1. When the wafer stage 6 is moved at a high speed to follow up this lateral shift so as to cancel it, the relative positions of the movable mirror 7X and the reference mirror 8X for the laser interferometer 9X change. In addition, owing to the flow of air accompanying the movement of the wafer stage 6, the refractive index of the laser interferometer 9X fluctuates to cause a change in optical path length. These changes in relative position, optical path length, and the like are the causes of the variations in the measurement signal SX shown (b) in FIG. 4.

In this embodiment, the main control system 12 samples the measurement signal SX in the period T by using a clock signal having a predetermined high frequency, and the memory 13 in FIG. 2 stores the sampled measurement signal SX. In addition, assuming that the Y-direction detection signal of the detection signal SA keeps coinciding with a predetermined aimed value during the period T, the measurement signal SY supplied from the laser interferometer 9Y in FIG. 2 during the period T is also stored in the memory 13.

Subsequently, the flow advances to step 105 to check whether any area to be step-driven remains. If YES in step 105, the flow returns to step 102 to step-drive the wafer stage 6. When steps 101 to 104 are repeated with respect to the areas, on the test wafer, corresponding to the shot arrangement to be subjected to an actual exposure operation, the measurement signals SX and SY within the period T shown (b) in FIG. 4 are stored in the memory 13 in correspondence with each shot area to be actually exposed.

Note that, for example, when the measurement signal SX within the period T shown (b) in FIG. 4 is to be obtained with respect to a given shot area, it is preferable that a stepping operation be repeated a plurality of number of times with respect to an area, on the test wafer, corresponding to the shot area, and the obtained measurement signals SX be averaged.

If there is no area to be step-driven, the flow advances from step 105 to step 106. In step 106, the wafer 5 to be actually exposed is placed on the wafer stage 6. In step 107, the wafer stage 6 is step-driven, and the positions (X- and Y-coordinates) of alignment marks near a plurality of shot areas on the wafer 5 are detected by the off-axis alignment system 15, thereby obtaining the shot arrangement of the exposure target areas on the wafer 5. In this case, the positions of the alignment marks near all the shot areas as aimed exposure areas on the wafer 5 may be detected by the alignment system 15. If, however, a so-called global alignment scheme is to be applied, the positions of only two or more alignment marks on the wafer 5 may be detected.

In the global alignment scheme, the coordinates (the measurement results obtained by the laser interferometers 9X and 9Y), of two or more alignment marks on the wafer 5, located on the apparatus coordinate system of the wafer stage 6 are obtained, and a coordinate conversion formula for converting the sample coordinate system on the wafer 5 into the apparatus coordinate system is obtained from the coordinates by a statistical process. By performing coordinate conversion of the coordinates of the respective alignment marks on the sample coordinate system on the wafer 5 by using the coordinate conversion formula, the coordinates of the alignment marks on the apparatus coordinate system can be obtained. The details of such a global alignment scheme are disclosed in, e.g., U.S. Pat. No. 4,780,617.

In step 108, the wafer stage 6 is step-driven to coordinates, as aimed positions, obtained by correcting the coordinates on the apparatus coordinate system, obtained by step 107, by the base line amount, in the shot order obtained when the test wafer was step-driven. With this operation, the respective shot areas as aimed exposure areas of the wafer 5 are sequentially moved into the exposure field of the projection optical system 4.

In step 109, the main control system 12 in FIG. 2 brings the measurement signals SX and SY, respectively output from the X-axis and Y-axis laser interferometers 9X and 9Y, near the aimed value set for a given shot area as an exposure target through the drivers 14X and 14Y. Thereafter, the main control system 12 reads out the waveforms of the measurement signals SX and SY stored in the memory 13 in correspondence with the shot area, and drives the wafer stage 6 through the drivers 14X and 14Y such that the actually output measurement signals SX and SY coincide with the readout waveforms. That is, the main control system 12 drives the wafer stage 6 so as to reproduce the waveforms of the measurement signals SX and SY stored in the memory 13. In addition, a pattern image in a pattern area of the reticle 1 is projected/exposed on the shot area on the wafer 5 while the waveforms read out from the memory 13 coincides with the waveforms of the actually output measurement signals SX and SY (step 110).

In step 111, it is checked whether a shot area to be exposed remains on the wafer 5. If YES in step 111, the flow shifts to step 108 to perform a stepping operation with respect to the next shot area to be exposed. In steps 109 and 110, the vibrations of the wafer stage 6 are reproduced, and exposure is effected. In this manner, pattern images of the reticle 1 are exposed on all the shot areas as aimed exposure areas on the wafer 5.

In step 112, it is checked whether any wafer to be exposed remains. If YES in step 112, the flow shifts to step 106. Subsequently, in steps 106 to 111, the vibrations of the wafer stage 6 and exposure are effected by the above-described operation. In this manner, exposure is effected with respect to all the wafers to be exposed.

As has been described above, according to this embodiment, a test wafer is placed on the wafer stage 6, and the state of vibration (the state of position change) of the wafer stage 6 in a stepping operation is obtained by the TTR alignment systems 3A and 3B. In an actual exposure operation, positioning of each shot area of a wafer is performed on the basis of the position of each alignment mark detected by the off-axis alignment system 15, and a pattern image of the reticle 1 is exposed on each shot area while the state of vibration (the state of position change) of the wafer stage 6, obtained by using the test wafer, is reproduced. Therefore, exposure can be effected with respect to the wafer 5 with a high throughput while positioning errors accompanying the fast stepping operation of the wafer stage 6 are reduced.

In the above-described embodiment, the pair of TTR alignment systems 3A and 3B are arranged along the X-axis. However, a pair of alignment systems may be arranged along the Y-axis. In this case, alignment marks are also formed outside the pattern area on the reticle 1 in the Y direction. In the above embodiment, in order to store the state of vibration (the state of position change) of the wafer stage 6, the measurement signals SX and SY output from the laser interferometers 9X and 9Y are stored. However, for example, the waveforms of drive signals supplied to the drivers 14X and 14Y may be stored instead.

Furthermore, instead of using the test wafer 5A which is specially prepared, for example, the first one of the wafers of one lot to be actually exposed may be used as a test wafer to check variations in position of the wafer stage 6.

It is apparent that when alignment of a wafer is to be performed by using a TTL alignment system, the wafer stage 6 can be controlled by using the stored measurement signals SX and SY.

As described above, the present invention is not limited to the above-described embodiment, and various changes and modifications can be made without departing from the spirit and scope of the invention.

What is claimed is:

1. An exposure method using a projection exposure apparatus including a projection optical system for projecting a pattern formed on a mask onto a substrate, a substrate stage holding the substrate and capable of moving within a plane substantially perpendicular to an optical axis of said projection optical system, a mask stage holding the mask, and a sensor for detecting a relative position of said substrate stage and said mask stage in a direction perpendicular to said optical axis, comprising:

the first step of detecting a positional shift amount in said direction of a mark on a first substrate with respect to a mark on the mask through said projection optical system;

the second step of detecting an output signal of said sensor while said relative position is changing so that said positional shift amount is cancelled;

the third step of detecting a position of a mark on a second substrate without the mediacy of the mask; and the fourth step of aligning the second substrate in accordance with the position of the mark obtained in the third step, and adjusting the relative position of said mask and said second substrate in a direction perpendicular to said optical axis in accordance with said output signal detected in the second step when said pattern of said mask is to be projected on said second substrate.

2. A method according to claim 1, wherein the second step includes the step of storing a state of position variation of said substrate stage while a positional relationship between the mask and the first substrate is maintained so that said positional shift amount becomes zero.

3. A method according to claim 1, wherein a mark on the first substrate is formed in correspondence with a mark on the second substrate.

4. A method according to claim 1, wherein the first substrate is a test substrate, and the second substrate is a substrate which has a photosensitive layer formed on a surface thereof and is to be actually exposed.

5. A method according to claim 1, wherein the fourth step includes the step of moving said substrate stage so as to reproduce said position of said substrate stage.

6. A method of according to claim 1, wherein the fourth step includes the step of aligning the second substrate in accordance with a result obtained by statistically processing the position of the mark obtained in the third step.

7. A method according to claim 1, wherein the third step includes the step of detecting a mark on the second substrate without the mediacy of said projection optical system.

8. A method according to claim 1, wherein the first and second steps are performed repeatedly with respect to a plurality of marks on said first substrate, and the position of said substrate stage in the second step in an average of positions of said substrate stage.

9. A method according to claim 1, wherein said adjusting said relative position includes moving said substrate stage.

10. A method according to claim 9, wherein said sensor detects a position of said substrate stage.

11. A method according to claim 1, wherein said sensor detects a position of said substrate stage.

12. A method according to claim 1, wherein said output signal detected in the second step is a waveform that varies as a function of time.

13. An exposure apparatus comprising:

a projection optical system for projecting a pattern formed on a mask onto a substrate;

a substrate stage holding the substrate and capable of moving within a plane substantially perpendicular to an optical axis of said projection optical system;

a stage position detector for detecting a position of said substrate stage within the plane and producing an output signal;

a first alignment system for detecting a positional shift amount, in a direction perpendicular to said optical axis, of a mark on the substrate with respect to a mark on the mask through said projection optical system;

a second alignment system for detecting a position of a mark on the substrate without the mediacy of the mask;

a storage device for storing said output signal of said stage position detector while said substrate stage is moving in said direction, so that said positional shift amount is cancelled; and a controller for aligning said substrate stage in accordance with the position of the mark detected by said second alignment system, said controller moving said substrate stage in accordance with said output signal read out from said storage device when the pattern is to be projected on the substrate.

14. An apparatus according to claim 13, wherein said second alignment system detects a mark on the substrate without the mediacy of said projection optical system.

15. An apparatus according to claim 13, wherein said controller moves said substrate stage so as to generate an output signal from said stage position detector that substantially reproduces said output signal read out from said storage device.

16. An apparatus according to claim 13, wherein said output signal is a waveform that varies as a function of time.

17. An exposure apparatus comprising:

a projection optical system for projecting a pattern formed on a mask onto a substrate;

a substrate stage holding the substrate and capable of moving within a plane substantially perpendicular to an optical axis of said projection optical system;

a laser interferometer for outputting a detection signal corresponding to a position of said substrate stage within the plane;

a first alignment system for detecting a positional shift amount, in a direction perpendicular to said optical axis, of a mark on the substrate with respect to a mark on the mask through said projection optical system;

a second alignment system for detecting a position of a mark on the substrate without the mediacy of the mask;

a first control section for controlling said substrate stage so that said positional shift amount is cancelled in accordance with detection information from said first alignment system;

a memory for storing a detection signal from said laser interferometer when said first control section controls said substrate stage; and a second control section for aligning said substrate stage in accordance with the position of the mark detected by said second alignment system, said second control section moving said substrate stage in accordance with the detection signal read out from said memory when the pattern is to be projected on the substrate.

18. An apparatus according to claim 17, wherein said detection signal is a waveform that varies as a function of time.

19. An exposure method using a projection exposure apparatus including a projection optical system for projecting a pattern formed on a mask onto a substrate, a substrate stage holding the substrate and capable of moving within a plane substantially perpendicular to an optical axis of said projection optical system, and a laser interferometer for outputting a detection signal corresponding to a position of said substrate stage within the plane, comprising:

the first step of detecting a positional shift amount, in a direction perpendicular to said optical axis, of a mark on a first substrate with respect to a mark on the mask through said projection optical system;

the second step of storing a detection signal from said laser interferometer while said substrate stage is moving in said direction so that said positional shift amount is cancelled;

the third step of detecting a position of a mark on a second substrate without the mediacy of the mask; and the fourth step of aligning the second substrate in accordance with said detection signal and the position of the mark obtained in said third step when said pattern of said mask is to be projected on said second substrate.

20. A method according to claim 19, wherein said detection signal is a waveform that varies as a function of time.

21. An exposure method comprising:

a step of detecting a change of an output signal of a detector for detecting relative position of a mask and a first substrate while said mask and said first substrate are being aligned by a first alignment system which detects a mark on said mask and a mark on said first substrate through a projection optical system;

a step of detecting position of a mark on a second substrate by a second alignment system different from said first alignment system; and a step of adjusting relative position between said mask and said second substrate according to the change of the output signal of said detector while said mask and said second substrate are being aligned according to the output signal of said detector and said detected position obtained by said second alignment system.

22. A method according to claim 21, wherein the change of the output signal is represented by a waveform that varies as a function of time.

* * * * *